(12) United States Patent
Ceylan et al.

(10) Patent No.: US 10,380,317 B2
(45) Date of Patent: Aug. 13, 2019

(54) DETERMINING STRUCTURE AND FUNCTIONALITY OF SCANNED OBJECTS

(71) Applicant: Adobe Inc., San Jose, CA (US)

(72) Inventors: Duygu Ceylan, Mountain View, CA (US); Byungmoon Kim, Sunnyvale, CA (US); Aron Monszpart, London (GB); Vladimir Kim, Seattle, WA (US); Niloy Mitra, London (GB)

(73) Assignee: ADOBE INC., San Jose, CA (US)

( * ) Notice: Subject to any disclaimer, the term of this patent is extended or adjusted under 35 U.S.C. 154(b) by 429 days.

(21) Appl. No.: 15/063,183

(22) Filed: Mar. 7, 2016

(65) Prior Publication Data

US 2017/0255712 A1    Sep. 7, 2017

(51) Int. Cl.
*G06F 17/50*    (2006.01)

(52) U.S. Cl.
CPC .............................. *G06F 17/5086* (2013.01)

(58) Field of Classification Search
None
See application file for complete search history.

(56) References Cited

PUBLICATIONS

Sturm, J., Stachniss, C., & Burgard, W. (2011). A probabilistic framework for learning kinematic models of articulated objects. Journal of Artificial Intelligence Research, 41, 477-526. (Year: 2011).*

Global Range Scans of Dynamic Range Scans for Articulated Model Reconstruction; Will Chang, Matthias Zwicker; ACM Transactions on Graphics; 2011.

ICPIK: Inverse Kinematics based Articulated ICP; Shachar Fleishman, Mark Kliger, Alon Lerner, Gershom Kutliroff; CVPRWorkshops; 2015.

Articulated and Restricted Motion Subspaces and Their Signatures; Bastien Jacquet, Roland Angst, Marc Pollfeys; ETH Zurich, Switzerland, Stanford University, USA, 2013.

\* cited by examiner

*Primary Examiner* — Bijan Mapar
(74) *Attorney, Agent, or Firm* — Keller Jolley Preece

(57) ABSTRACT

Methods and systems for generating digital models from objects. In particular, one or more embodiments determine a plurality of correspondences for first and second components of an object. One or more embodiments estimate a joint connecting the first and second components based on the correspondences. One or more embodiments jointly determine a global transformation and one or more joint parameters that map the plurality of components of the object from the first digital scan to the second digital scan. One or more embodiments also updating the correspondences based on the determined global transformation and parameter(s). One or more embodiments re-estimate the joint based on the updated correspondences. One or more embodiments select a candidate joint with a lowest error estimate from a plurality of candidate joints according to determined global transformations and joint parameter(s) for the candidate joints.

20 Claims, 10 Drawing Sheets

DETERMINING STRUCTURE AND FUNCTIONALITY OF SCANNED OBJECTS

1. TECHNICAL FIELD

One or more embodiments relate generally to systems and methods for determining object structures. More specifically, one or more embodiments of the present invention relate to systems and methods of determining structure and functionality of objects from digital scans of the objects.

2. BACKGROUND AND RELEVANT ART

Creating digital content from digital scans of real-world objects is a convenient way to produce realistic digital objects. Specifically, digitizing real-world objects involves scanning an object in various static poses using various scanning technologies and reconstructing a three-dimensional digital version of the object. By scanning objects and creating digital versions, content creators can create a library of digital objects. In particular, by using digital scanning, content creators are able to create digital content more quickly, and often more accurately, than by creating the digital objects from scratch.

While scanning techniques allow content creators to create digital versions of real-world objects, conventional scanning techniques have drawbacks. For example, an object, which has joints or other movable connections, includes components that translate and/or rotate with respect to other components of the object. Capturing the simple geometry of such objects is typically not sufficient for recreating a complete structure of the objects in digital form. Without capturing of the functionality (e.g., movable connections) of the various components of the objects, the digital versions may potentially require content creators to modify the digital versions to achieve correct functionality.

Some conventional content digitizing systems use scanning techniques to identify structure and functionality of an object for creating digital models of the object. Specifically, to identify the functionality of objects, some conventional content digitizing systems require animating or re-posing an object to identify movable components of the object and connection types between the movable components. For example, conventional systems capture the functionality using a plurality of digital scans (e.g., by animating a motion of the movable components) to accurately reproduce the object in a digital format. Using animations or large numbers of digital scans to reproduce digital content, however, can require significant amounts of processing power and time. Such conventional systems are also frequently limited in the types of joints or connections that the systems can identify with accuracy.

Additionally, conventional content digitizing systems typically assume ideal conditions (e.g., noiseless digital scans/captured geometries). When introducing noise into the digital scans/captured geometries, the conventional systems are more likely to return erroneous structure and joint estimations. Specifically, conventional systems that perform only sequential analysis across a plurality of digital scans can introduce estimation errors when using noisy digital scans. Thus, conventional systems have difficulty processing noisy digital scans or image captures to obtain an accurate digital model of a real-world object.

These and other disadvantages may exist with respect to conventional content digitization techniques.

SUMMARY

Introduced here are techniques/technology for determining structure and functionality of scanned objects. One or more embodiments include systems and methods to estimate a joint of an object using a plurality of scans of the object. In particular, one or more embodiments estimate a joint of the object based on a plurality of correspondences for a plurality of components of the object in a first digital scan and a second digital scan of the object. One or more embodiments jointly determine a global transformation and one or more joint parameters that map the components from the first digital scan to the second digital scan. Additionally, one or more embodiments update the plurality of correspondences for the plurality of components using the global transformation and the one or more joint parameters, and re-estimate the joint based on the updated correspondences.

One or more embodiments of the systems and methods also estimate a plurality of candidate joints for selecting a most accurate joint for the object. Specifically, one or more embodiments determine the plurality of candidate joints based on the correspondences for the plurality of components. One or more embodiments also determine a global transformation and one or more joint parameters for each candidate joint. Additionally, one or more embodiments select a candidate joint with a lowest estimation error according to the determined global transformation and the one or more joint parameters for the plurality of candidate joints.

Additional features and advantages of one or more embodiments of the present disclosure will be set forth in the description which follows, and in part will be obvious from the description, or may be learned by the practice of such example embodiments.

BRIEF DESCRIPTION OF THE DRAWINGS

Various embodiments will be described and explained with additional specificity and detail through the use of the accompanying drawings in which.

DETAILED DESCRIPTION

Figure 1A:
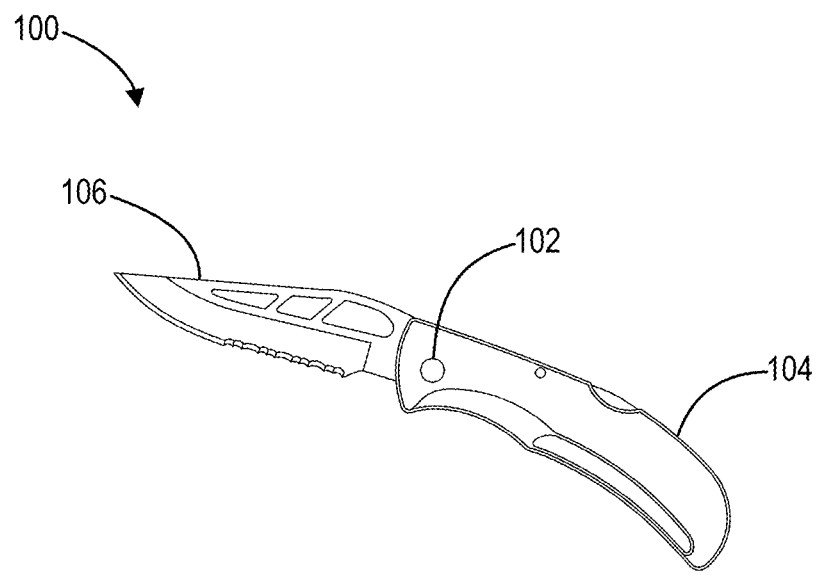
FIGS. 1A-1B illustrate schematic diagrams of an object in different positions in accordance with one or more embodiments.

One or more embodiments of the present disclosure include an object digitizing system for creating digital content from real-world objects. Specifically, the object digitizing system ("digitizing system") scans a real-world object and produces a digital model of the object while maintaining a structure and function of the object. For example, the digitizing system identifies joints in the object and recreates the joints in the digital model to be usable consistently with the joints in the object. By identifying and recreating joints in a digital model from a real-world object, the digitizing system allows content creators to quickly and accurately recreate digital content for a variety of uses.

Additionally, the digitizing system uses an iterative process to estimate joints in the object. For example, the digitizing system alternates between estimating a joint of the object and determining alignment parameters for aligning a plurality of digital scans. By iteratively alternating between updating the alignment parameters and updating the estimation of the joint, the digitizing system generates a result that converges on a particular joint from a plurality of possible joints. In at least some instances, noise is present due to difficulties in establishing correspondences across multiple digital scans because of inaccurate geometry and ambiguities in the digital scans. The iterative process allows the digitizing system to generate an accurate joint estimation for the object even in the presence of noise in one or more of the digital scans and/or captured geometries associated with the digital scans by increasing the accuracy of the correspondences between the digital scans with each iteration.

In one or more embodiments, the digitizing system estimates a joint in an object based on a plurality of digital scans of the object. In particular, the digitizing system identifies a plurality of positions (i.e., poses) of the object from the plurality of digital scans. Based on the plurality of positions, the digitizing system estimates a joint between a plurality of different components of the object. For example, the digitizing system estimates the joint by determining how each component of the object translates or moves in relation to the other components of the object based on at least two digital scans of the object.

Additionally, the digitizing system aligns digital scans for the object based on the position of the object in the digital scans. Specifically, one or more embodiments identify correspondences between points in the digital scans, the correspondences being associated with points of the object that are translated or rotated from a first digital scan to at least a second digital scan. The correspondences allow the digitizing system to determine a change in position for the corresponding points of the object from the first digital scan to the second digital scan. For example, the digitizing system determines at least a first correspondence for at least one point on a first component of the object and at least a second correspondence for at least one point on a second component of the object. By determining how the points of the object are translated and/or rotated from the first digital scan to the second digital scan based on the identified correspondences, the digitizing system aligns the first digital scan and the second digital scan.

In one or more embodiments, aligning the digital scans involves estimating a joint of the object. In particular, the digitizing system estimates a joint for the object based on changes of the position of the object from the first digital scan to at least the second digital scan. For example, the digitizing system uses the determined correspondences to compare the positions of various components of the object from one digital scan to another and estimate a joint that allows movement consistent with the changes in positions of the various components. To illustrate, the digitizing system calculates a global transformation (rotation and/or translation) that quantifies the change in position of the object in the first digital scan relative to the second digital scan. More particularly, the digitizing system calculates a translational and/or rotational difference between a position of the object in the first digital scan and a position of the object in the second digital scan. Thus, the digitizing system aligns the digital scans by performing a transformation to the digital model representing the object to align the components of the digital model in the second digital scan to the components of the digital model in the first digital scan.

As alluded to above, one or more embodiments of the digitizing system improve the accuracy of the estimation of the joint by iterating between joint estimation and determining alignment parameters for aligning the digital scans of the object. Specifically, after obtaining a joint estimation and aligning the digital scans, the digitizing system updates the parameters for aligning the digital scan and then re-estimates the joint of the object. The digitizing system iterates between estimating the joint of the object and updating alignment parameters until a result converges on one of a plurality of possible joint estimations. Using the iterative process to narrow the estimation to a single joint estimation based on previous estimation data allows the digitizing system to account for noise in the digital scans and/or captured geometries and obtain an accurate joint estimation.

As previously mentioned, the digitizing system determines the structure of the object from a plurality of digital scans. The digitizing system also determines a functionality of the object based on the structure of the object. In particular, the functionality of an object is typically defined by the structure of the object (i.e., the various physical parts of the object and connections between the parts). For example, a joint allows movement of various components of the object and defines a relationship between separate components (e.g., a first component covers a second component, a first component fits inside a second component, a first component slides along a second component). By capturing the structure and functionality of the object, the digitizing system can reproduce the object in a digital medium (e.g., a 3D model). After creating a digital model with the structure and functionality of the real-world model, a content creator or use can use the digital model in a variety of virtual applications in the same way the real-world object functions.

As described herein, the digitizing system provides advantages over conventional content digitizing techniques by providing improved accuracy when creating digital models from real-world objects. Specifically, because the digitizing system uses an iterative process to narrow the number of possible joints with each iteration, the digitizing system can identify a wider variety of joints than conventional techniques. For example, the digitizing system improves accuracy in estimating joints when noise is present in digital scans of an object by performing an iterative process that alternates between updating joint estimation for the object and updating alignment parameters for aligning digital scans of the object.

Additionally, the one or more embodiments of the digitizing system provides information about object structure and functionality that conventional techniques are unable to determine. In particular, the digitizing system can provide additional structural details about a joint. For example, the digitizing system can analyze a joint between two components to determine high-level relationships between the components. To illustrate, the digitizing system can infer relationships such as "covers," "fits inside," "partially fits inside," "slides along," or other relationships that affect both the visible structure and the functionality of the components.

Figure 1B:
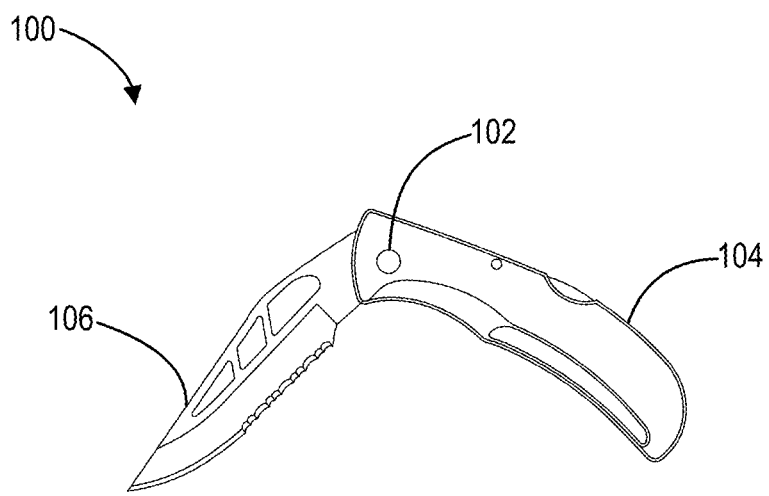

FIGS. 1A-1B illustrate schematic diagrams of an object. Specifically, FIGS. 1A-1B illustrates an object 100 (i.e., a folding knife) with a plurality of components connected by a joint 102. For example, as illustrated, the joint 102 is a hinge joint that allows a first component 104 of the object to rotate with respect to a second component 106 of the object. Although FIGS. 1A-1B illustrate an object 100 with a hinge joint 102, the digitizing system can identify a variety of different joints. As will be described in more detail below, the digitizing system can identify joints including, but not limited to, hinge joints, ball joints, sliding hinge joints, prismatic joints, fixed joints (no moving components), and no joints (free moving components).

As illustrated in FIG. 1A, the object 100 is in a first position with the first component 104 of the object at a first angle relative to the second component 106 of the object 100. In particular, the first component 104 of the object 100 is extended away from the second component 106 of the object 100 as far as the joint 102 allows. For example, the joint 102 may allow limited movement of the first component 104 and the second component 106 of the object 100. To illustrate, the hinge 102 of FIG. 1A allows the first component 104 of the object 100 to rotate from a fully extended position (e.g., 180 degrees) to any other angle between full extension and a position inside the second component 106 of the object 100 (e.g., from 0 degrees to 180 degrees). FIG. 1B illustrates a partial rotation of the first component 104 relative to the second component 106.

In one or more embodiments, the joint 102 includes at least a portion of the structure of the object 100 that limits movement of the first component 104 and the second component 106 of the object 100. For example, the structure of the object 100 illustrated in FIG. 1A includes at least a portion of the first component 104 and/or a portion of the second component 106 that inhibits rotation of the components beyond a given angle along a particular axis. Additionally, the joint 102 may include other characteristics that limit the movement along the axis or along other axes. For example, a hinge joint may only allow rotation along a single axis and prohibit rotation or translation in any other direction.

Figure 2:
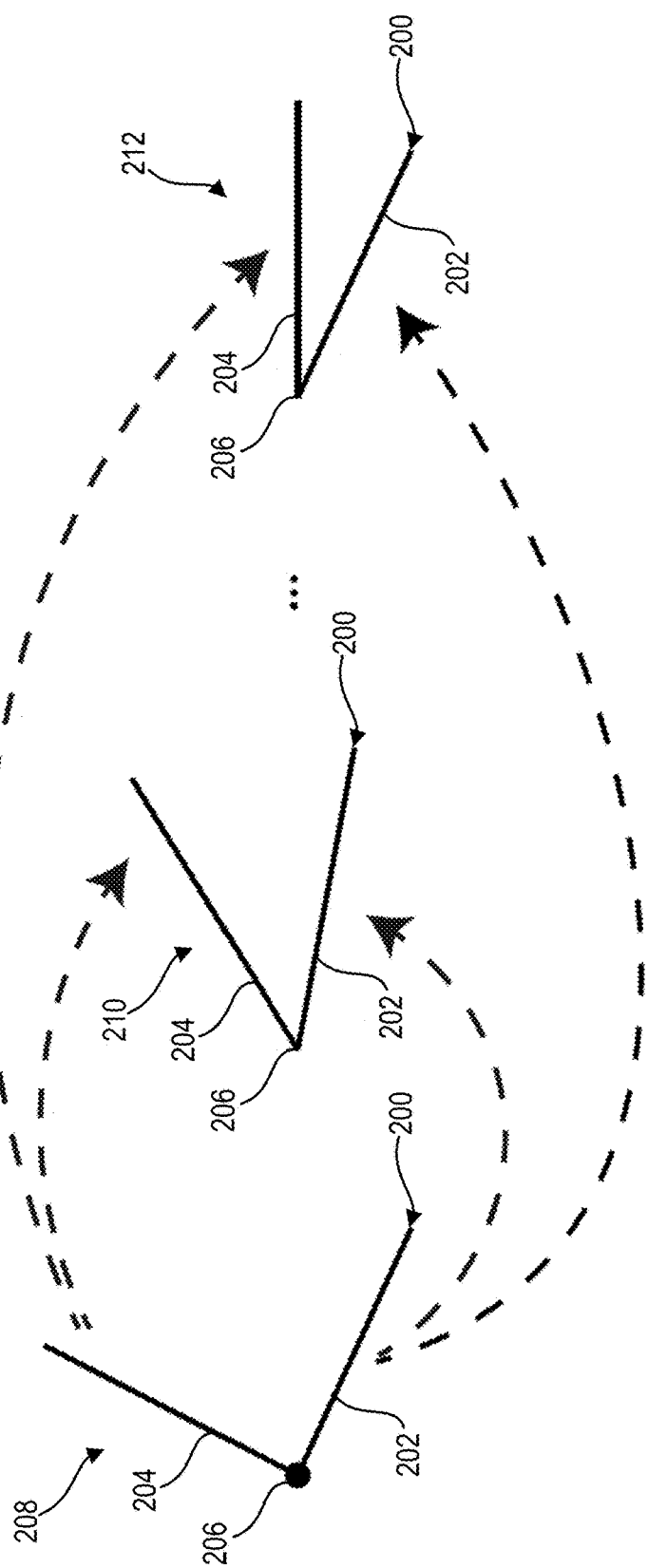
FIG. 2 illustrates a schematic diagram of a plurality of simplified representations of digital scans of an object in accordance with one or more embodiments.

To capture the structure and function of an object, the digitizing system captures a plurality of digital scans of the object. As used herein, the term "digital scan" refers to a two-dimensional digital image representing an object. For example, a digital scan can include, but is not limited to, a photograph or a drawing (hand drawn or digital) of an object. In still further embodiments, the term digital scan refers to a three-dimensional digital image of an object. FIG. 2 illustrates simplified representations of digital scans of an object 200. Specifically, the digital scans of FIG. 2 include a simple object with a first component 202 and a second component 204 connected by a joint 206. To illustrate, the object 200 includes a hinge joint 206 that allows the first component 202 and the second component 204 to rotate about the hinge joint 206 with respect to each other.

In one or more embodiments, the digitizing system captures at least two digital scans of the object 200 in different positions. In alternative embodiments, the digitizing system captures at least three digital scans of the object in different positions, as may be useful in identifying ball joints or other joints that allow more than one axis of rotational movement between components. Alternatively, the digitizing system uses other numbers of digital scans, as may serve a particular embodiment. For example, the digitizing system can use up to i numbers of digital scans.

FIG. 2 illustrates a generic case of capturing up to i numbers of digital scans of the object 200 in which each digital scan includes a different position for the object. Specifically, each digital scan includes a position illustrating possible movements of the first component 202 and the second component 204 in accordance with the joint 206 connecting the first component 202 and the second component 204. For example, a first digital scan 208 illustrates the object 200 in a first position with the first component 202 and the second component 204 connected at the joint 206. A second digital scan 210 illustrates the object 200 in a second position with the first component 202 and the second component 204 closer together than in the first digital scan 208, indicating that the joint 206 allows the first component 202 and the second component 204 to rotate closer together. A third digital scan 212 illustrates the object in yet another position in which the first component 202 and the second component 204 are closer together than in either of the first digital scan 208 or the second digital scan 210.

Using the plurality of digital scans, the digitizing system segments the object 200 into a plurality of different components. In particular, the digitizing system identifies the first component 202, the second component 204, and the joint 206 (i.e., the existence of the joint) of the object 200 in FIG. 2. For example, the digitizing system decomposes the object 200 into different components based on the positions of the various components in the plurality of digital scans. Thus, the digitizing system can determine that portions of an object that move relative to each other and/or to other portions of the object are distinct components. The digitizing system treats the components as individual components and identifies joints connecting the corresponding components.

After identifying the separate components (e.g., the first component 202, the second component 204, and the joint 206 of the object 200) from the plurality of digital scans, the digitizing system then analyzes the digital scans to determine how the components move with respect to each other. In particular, the digitizing system identifies a plurality of feature correspondences across the plurality of digital scans. Specifically, as used herein, a "feature correspondence" or "correspondence" refers to a feature of a component of an object that appears in a plurality of digital scans of the object. For example, a feature correspondence can include a feature of a specific component of an object identified based on the color of the feature and the normal of an acquired geometry of the object. Additionally, a feature correspondence can be associated with a specific point or location of the component. Alternatively, a feature correspondence can include the component itself.

The digitizing system uses image processing techniques, such as feature matching, to establish the feature correspondences across the plurality of digital scans. For example, the digitizing system can identify color boundaries, structural features, or other visual features that allow the digitizing system to identify one or more specific locations on a component of the object. The digitizing system uses the identified feature correspondences to determine positions of the components of an object across a plurality of digital scans.

Based on the identified correspondences, the digitizing system determines the type of joint that produces the motions by the object components in the digital scans. Specifically, the digitizing system identifies transformations of the object components across the digital scans. For example, the digitizing system identifies the transformations by comparing the correspondences of each object component in the first digital scan relative to the correspondences of the object components in the second digital scan. Additionally, the digitizing system compares the correspondences of each object component in the first digital scan relative to the correspondences of the object components in any additional digital scans.

Using the identified transformations, the digitizing system then estimates the joint that connects the first component and the second component of the object. In particular, the digitizing system determines whether the range of motion associated with the identified transformations of the object components fit a particular joint type. For example, the digitizing system compares the identified transformations to known motions associated with each of a plurality of joint types to determine which joint type most closely corresponds to the identified transformations. To illustrate, the digitizing system determines that the transformations of the components of the object 200 in FIG. 2 correspond to a hinge joint because the transformations are only rotational motions on a single axis. Alternatively, if the transformations of the components of the object 200 correspond more closely to another joint type, the digitizing system can estimate the joint 206 to be other than a hinge joint.

When estimating the joint 206, the digitizing system determines one or more joint parameters associated with the joint 206. Specifically, the joint parameters identify characteristics of the joint 206 that allow the digitizing system to accurately reproduce the joint 206 in the digital model. For instance, joint parameters can include joint type, joint location, joint size, rotation constraints, transformation constraints, and other data that allows the digitizing system to provide the correct structure and functionality to the joint in the digital model. To illustrate, joint parameters for the object of FIG. 2 can include a joint location at one end of each of the first component 202 and the second component 204; the joint type as a hinge joint; and rotation constraints that restrict the rotation movement, including rotation angle and axis of rotation about which the first component and the second component rotate. For some types of joints, the joint parameters can include transformation amount and/or a transformation axis.

As previously mentioned, estimating the joint of an object can be simple when assuming ideal conditions (e.g., no noise in the digital scans or in geometries that the digitizing system produces for the digital scans). If the geometries generated from the digital scans include noise, whether as a result of the digital scans including noise or the digitizing system introduces noise while generating the geometries, joint estimation is a more complex process. Specifically, an initial estimation of the joint may have an accuracy or confidence level lower than 100%. In one or more embodiments, the digitizing system determines that several different joint types are possible with varying confidence levels.

To account for noise in the joint estimation process, the digitizing system performs iterative steps that increase the accuracy of joint estimation after each iteration. For example, as previously mentioned, the digitizing system performs an initial joint estimation based on an initial set of correspondences across digital scans and joint parameters for aligning the digital scans. The initial joint estimation may include a plurality of possible joint types with varying estimation errors and confidence levels.

To illustrate, the confidence level of a joint estimation may be based on an estimation error associated with the particular joint estimation. For instance, if the estimation error associated with a joint estimation is high, the confidence level of the joint estimation is low. Additionally, a high error value may place the confidence level of the corresponding confidence level below the confidence threshold. Alternatively, if the estimation error is low, the confidence level of the corresponding joint estimation may be high, and subsequently, the corresponding confidence level may be above the confidence threshold.

In one or more embodiments, the digitizing system determines a plurality of candidate joints based on the initial set of correspondences. Specifically, the digitizing system determines that a plurality of joint types is possible for a particular set of correspondences, each having an estimation error above zero. For example, due to the noise, the digitizing system is unable to produce a joint estimation with out any estimation error, and therefore, with a confidence level below 100%. If the confidence level of a joint estimation does not meet a threshold (e.g., a predetermined confidence threshold), the digitizing system can update correspondences and then re-estimate the joint.

If the digitizing system has identified a plurality of candidate joints, the digitizing system may use a minimization algorithm to determine a global transformation and one or more joint parameters for each candidate joint that fits the candidate joint to the digital scans. For example, if the digitizing system determines that one or more possible joint types have estimation errors that are approximately the same, or that all of the possible joint types have confidence levels below the confidence threshold, the digitizing system may apply the minimization algorithm for a plurality of possible joint types. The digitizing system can identify a candidate joint that has the lowest estimation error (i.e., that best fits the components to the digital scans) after applying the minimization algorithm and update the correspondences accordingly. Alternatively, the digitizing system can narrow the plurality of candidate joints to a smaller number of candidate joints.

After identifying one or more candidate joints using the minimization problem, the digitizing system then updates the correspondences using the corresponding global transformation(s) and one or more joint parameters. Additionally, the digitizing system groups the updated correspondences for the digital scans and uses the updated correspondences, the digitizing system re-estimates the joint to fit the components to the digital scans. By updating the correspondences and/or other information used to estimate the joint, the digitizing system can better align the scanned data, which increases the likelihood of identifying a joint type that meets the confidence threshold. Specifically, the digitizing system performs a plurality of iterations until the confidence levels of the joint parameters converge to a single joint estimation. In some instances, the digitizing system may perform few iterative steps (e.g., two) before the results converge, while in other instances the digitizing system may perform many iterative steps before the results converge on a single joint estimation.

Once the digitizing system has identified the components and estimated any joints of an object, the digitizing system can construct a digital model of the object. Specifically, the digitizing system generates the digital model to replicate the appearance and functionality of the real-world object. For example, a 3D model of the object in FIGS. 1A-1B can include functionality that allows a content creator or user to manipulate the object in connection with the estimated joint of the object. Thus, a user may rotate the blade of the knife relative to the handle (and vice versa) in a virtual environment.

Additionally, a user may use the digital model as a template or base model for creating a new object with similar structure and functionality. For example, the digitizing system can store the digital model as a file that the user can access using one more applications. To illustrate, if the user desires to create a similar object with new visual features, the user can modify one or more characteristics of the object. Specifically, the user may open the file with the digital model in an application to modify the appearance, the structure, and/or the functionality of the object.

As discussed previously, the digitizing system can use any number of digital scans to digitize an object, as may serve a particular purpose. FIG. 2 illustrates a general case of i digital scans for determining transformations for an object 200 with a first component 202 and a second component 204 to estimate a joint 206. To more specifically describe the generic case, an object 200 with j components is observed over i digital scans. The components are denoted $p_0$, $p_1, \ldots, p_{j-1}$, and the digital scans are numbered 0 through i-1, assuming that a first digital scan 208 is a reference frame. The digitizing system determines a matrix $T_{i,j}$ that denotes how the component $p_j$ moves in scan i with respect to the reference scan. Specifically, the digitizing system determines $T_{i,j}$ based on the feature correspondences established between $p_j$ in the reference scan and every other scan.

The location of the joint 206 connecting the first component 202 of the object 200 to the second component 205 of the object 200 is a common point for both components of the object 200. Thus, transformations to each of the components with respect to the reference scan map the joint location to the same location in the new digital scan. In other words:

$$T_{i,0}*x = T_{i,1}*x.$$

Each transformation of the components in the object is rigid, and the digitizing system can decompose the transformation into a rotation component R and a translation t, such that:

$$R_{i,0}*x + t_{i,0} = R_{i,1}*x + t_{i,1}, \text{ and}$$

$$(R_{i,0} - R_{i,1})*x = (t_{i,1} - t_{i,0}).$$

In case of a plurality of digital scans, the corresponding rotation matrices and translation vectors can be represented as a global left-hand side matrix M and a global right-hand side translation vector t:

$$\begin{bmatrix} R_{1,0} - R_{1,1} \\ R_{2,0} - R_{2,1} \\ \ldots \\ R_{i,0} - R_{i,1} \end{bmatrix} * x = \begin{bmatrix} t_{1,1} - t_{1,0} \\ t_{2,1} - t_{2,0} \\ \ldots \\ t_{i,1} - t_{i,0} \end{bmatrix}.$$

Using the above equations, the digitizing system can perform a singular value decomposition (SVD) process of $M = U*D*V^T$ and analyze the singular values to determine the type of the joint. For example, the joint types include, but are not limited to, a fixed joint, a prismatic joint, a hinge joint, a sliding hinge joint, a ball joint, and no joint, as previously mentioned. Each case is described in light of the SVD process below:

Case 0—Fixed Joint: The relative transformations of both components of the object are the same, and the object consists of a single component. For example, the object is a continuous component that does not have movable components. To illustrate, the digitizing system can determine that an object with an elbow or bend in the structure, a single-component object with design patterns that seem to indicate separate components, or similar object has a fixed joint from a plurality of digital scans of the object.

Case 1—Prismatic Joint: All singular values are 0. The relative transformation between the two components is only a translation and the relative translation axis provides the axis of the prismatic joint. In other words, the joint does not allow the components to rotate relative to each other. For example, an object that has at least one component that telescopes inside another component without rotating has a prismatic joint.

Case 2—Hinge Joint: Only one singular value is 0. The rotation axis of the hinge joint is given by the right singular vector (i.e., the last column of V, V(:,2)). In addition, there should be no translation component of the motion along the hinge axis:

$$(t_{i,1} - t_{i,0}) \cdot U(:,2) = 0.$$

To illustrate, an object such as in FIG. 1 includes a hinge joint.

Case 3—Sliding Hinge Joint: Only one singular value is 0. This is similar to the hinge joint, with the exception that there is also a translation component of the motion along the hinge axis:

$$(t_{i,1} - t_{i,0}) \cdot U(:,2) \neq 0.$$

For example, the digitizing system can determine that an object with a joint that allows a first component to rotate along a first axis and also translate along a second axis or plane with respect to a second component has a sliding hinge joint. To illustrate, the object may include a first component with a slot in which a hinge joint connected to a second component is disposed.

A special case of the sliding hinge joint is a screw where the translation component is proportional to the rotation. The digitizing system can detect such a case when there are more than two digital scans, and the relative motion of each digital scan preserves the same ratio between the rotation and the translation components of the motion.

Case 4—Ball Joint: None of the singular values is 0. The digitizing system can detect a ball joint if at least three digital scans are available. The digitizing system extracts the joint parameters by solving for a hinge joint between each digital scan and the reference scan. If the joint is a ball joint, the different hinge axes should intersect in a common point, indicating that the joint allows rotation along a plurality of different axes at the same central point.

Case 5—No Joint (Components move freely): None of the singular values is 0. This case is similar to a ball joint. However, the hinge axis determined from every pair of digital scans will have no intersection, indicating that both translation is allowed along a plurality of planes or axes and rotation is allowed a plurality of points or axes. For example, if the digitizing system detects that a plurality of components is connected with "no joint," the digitizing system may determine that the movement of the components is not constrained in any direction.

To evaluate the performance of the digitizing system, various experimental data is described below. Specifically, the experiments use synthetic objects with two components connected with different joint types. Additionally, the digitizing system uses synthetic digital scans of the object at different configurations (e.g., orientations and joint types). The digitizing system then analyzes the relative motion of the object components across the synthetic digital scans and predicts the type and parameters of the joint. The digitizing system repeats this test for different relative motions for each object configuration and reports the percentages of the joint estimations.

Figure 3A:
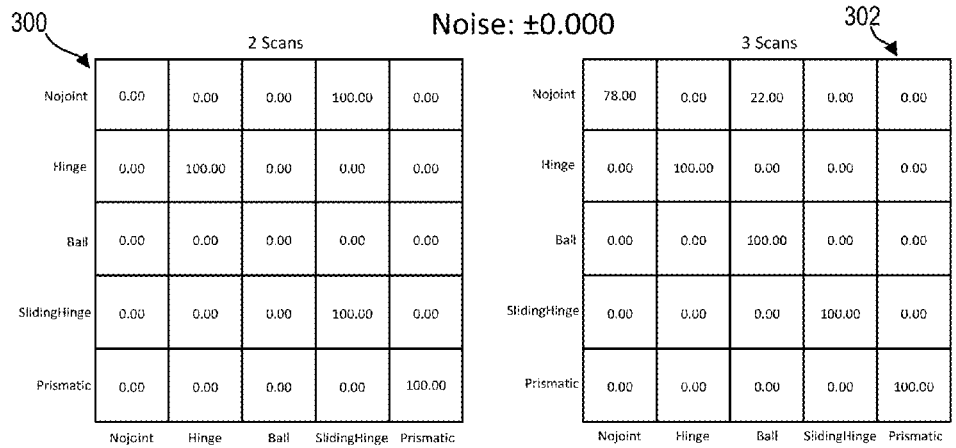
FIGS. 3A-3C illustrate a plurality of graph diagrams of joint estimation accuracies in accordance with one or more embodiments.
Figure 3B:
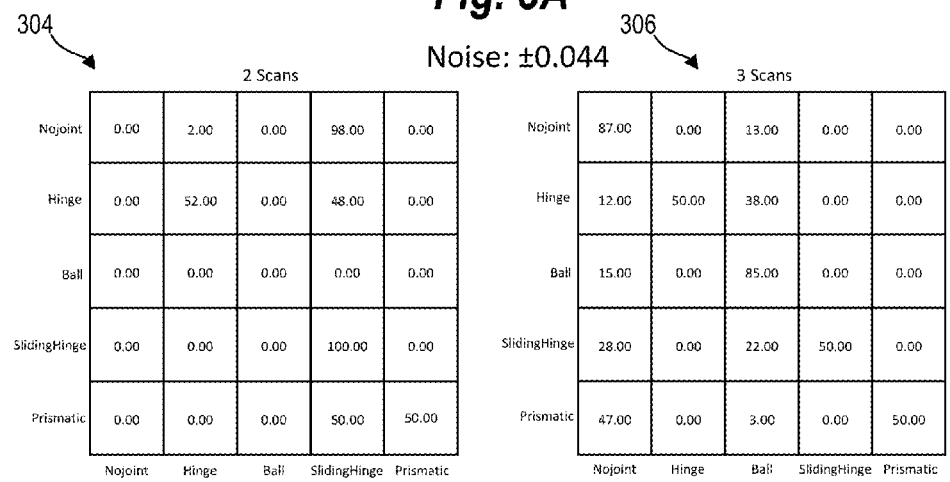
Figure 3C:
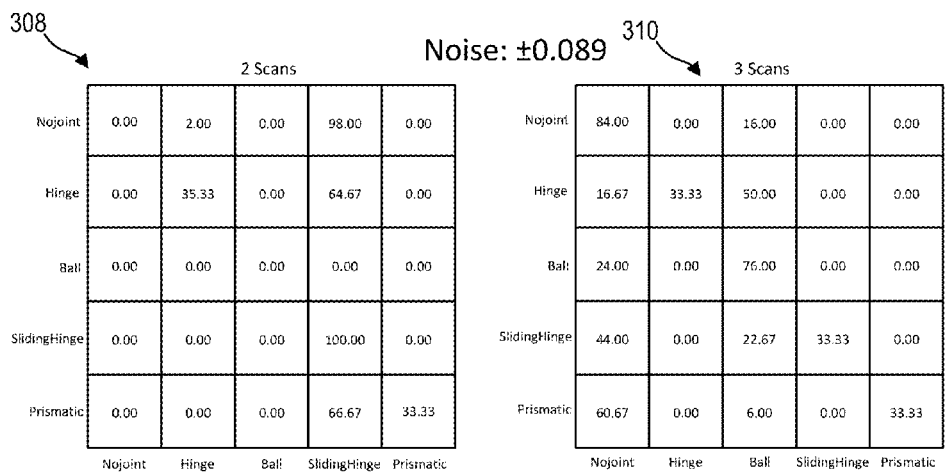

FIGS. 3A-3C illustrate a plurality of graphs including results of the tests associated with the various object configurations. FIG. 3A illustrates the results of the test for a noise-free case. Specifically, FIG. 3A illustrates a plurality of graphs 300, 302 with the performance of the digitizing system under ideal circumstances for a case using two digital scans and a case using three digital scans. The y-axis indicates the actual joint types for the test cases, and the x-axis indicates the estimated joint with the percentages for how often the digitizing system predicted each joint.

As illustrated, the digitizing system correctly predicted the joint type 100% of the time for each case except the no joint case and the ball joint case for two digital scans. Specifically, the ball joint case typically requires at least three digital scans because a ball joint can rotate around more than one axis, and each image is capable of illustrating a single axis of rotation. Additionally, two digital scans for the no joint case exhibit similar movements to a sliding hinge case (i.e., both translation and rotation), such that the digitizing system predicts a sliding hinge joint. For instance, the digitizing system may default to predicting an existing joint type in the absence of data indicating that the object fits the no joint case.

In the three image case, the digitizing system correctly predicted each case 100% of the time except for the no joint case. In particular, there are some instances in which a no joint case can be characterized by a ball joint. For example, if the three digital scans illustrate two relative motions with two intersecting rotation axes, the digitizing system may estimate the no joint case as a ball joint. As illustrated, however, such cases made up only 22% of the test cases, and the digitizing system correctly estimated the joint 78% of the time.

FIG. 3B illustrates a plurality of graphs 304, 306 indicating the performance of the digitizing system with noise inserted into the generated synthetic digital scans. Specifically, the experiments include noise inserted into the digital scans by perturbing the points in the digital scans by a specific amount. The diagonal of a bounding box of the digital scans is represented as 1.0. For example, FIG. 3B uses a plurality of digital scans are perturbed by an amount of ±0.004, or 8.8% noise.

As shown, the noise causes the digitizing system to estimate the joint types with a lower accuracy. To illustrate, the digitizing system incorrectly estimates the joints more frequently with the added noise in the two digital scan case and much more frequently in the three digital scan case. Similarly, FIG. 3C illustrates a plurality of graphs 308, 310 the performance of the digitizing system with digital scans that are perturbed by an amount of ±0.089, or 17.8% noise, causing the digitizing system to incorrectly estimate the joint type even more frequently. Thus, greater amounts of noise cause the digitizing system to provide initial joint estimations that are incorrect more frequently.

Figure 4:
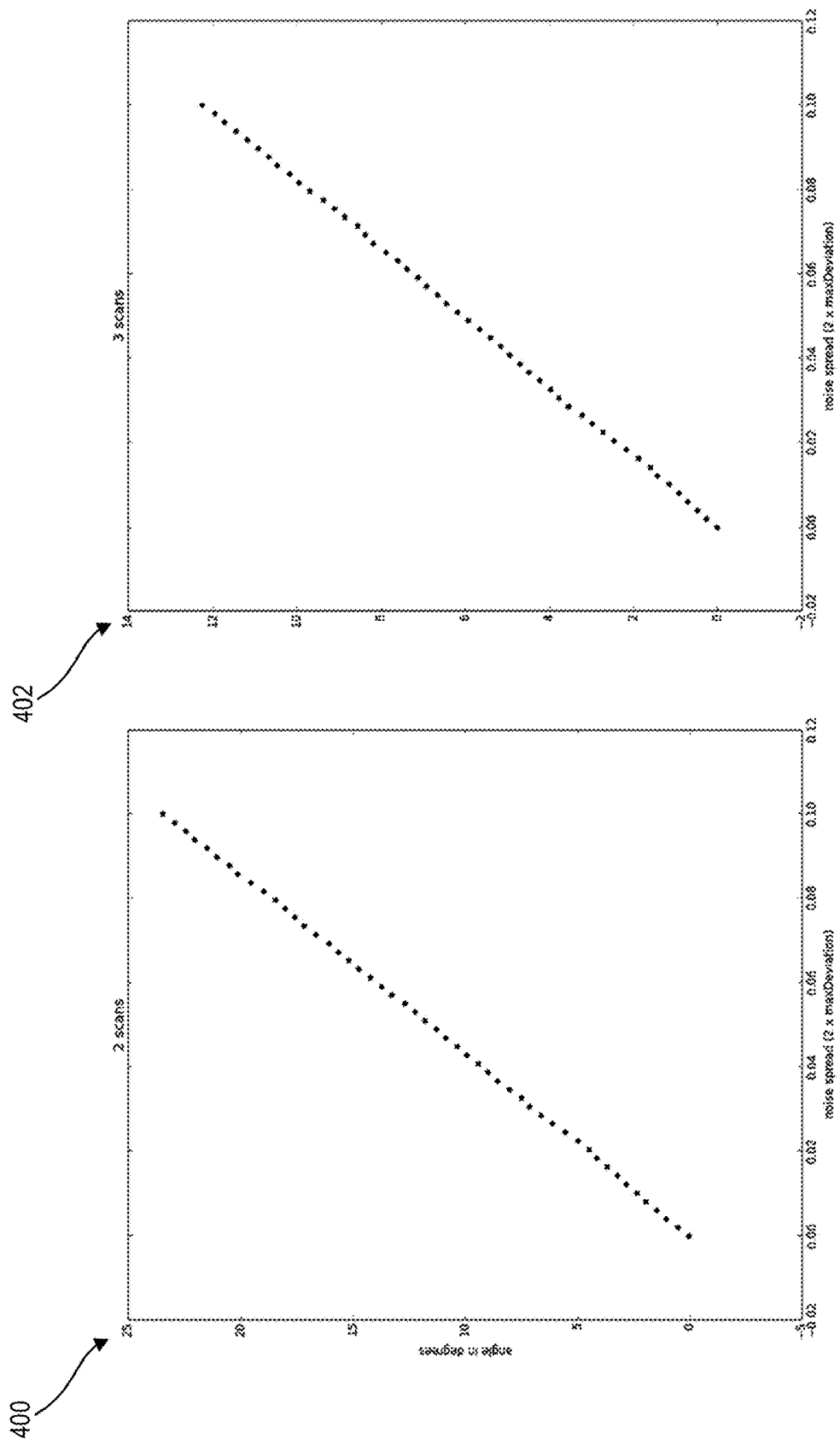
FIG. 4 illustrates a plurality of graph diagrams of angles between a ground-truth joint and an estimated joint with varying noise amounts in accordance with one or more embodiments.

Additionally, for the specific case of hinge joints, the experiments also evaluate the accuracy of the prediction of the joint parameters associated with the joint. FIG. 4 illustrates a plurality of graphs 400, 402 that indicate an angle between a ground-truth axis for a hinge joint and the axis for the hinge joint that the digitizing system predicted with increasing noise. Specifically, the y-axis indicates the angle in degrees, and the x-axis indicates the amount of noise introduced into the digital scans. FIG. 4 includes graphs 400, 402 for both the two digital scan case and the three digital scan case. As shown, the accuracy of the digitizing system in estimating the joint axis decreases with increased noise in the digital scans.

Figure 5A:
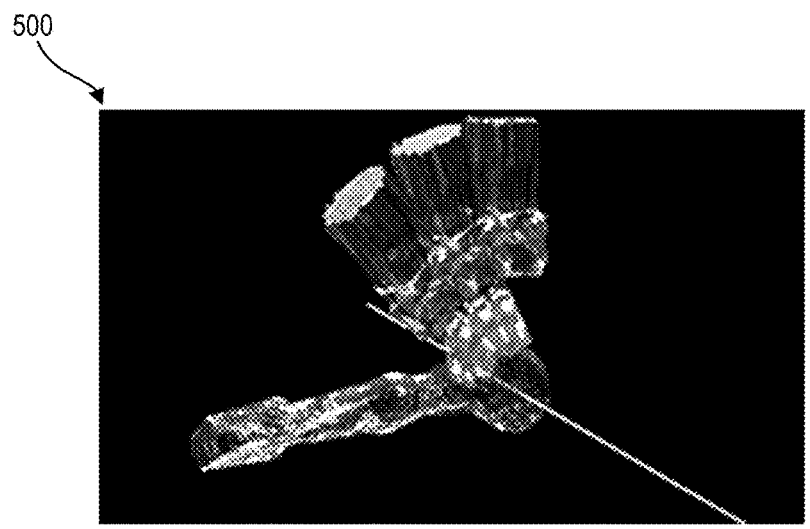
FIGS. 5A-5C illustrate a plurality of digital scans of a ground-truth joint axis and estimated joint axes in accordance with one or more embodiments.
Figure 5B:
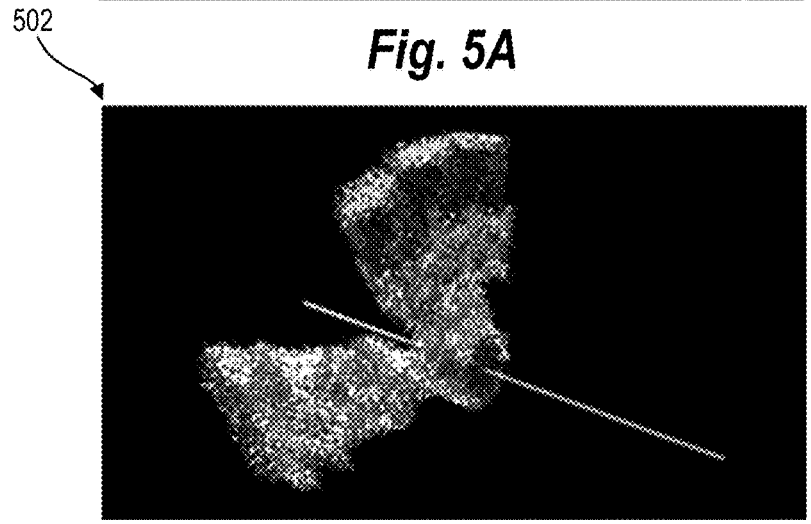
Figure 5C:
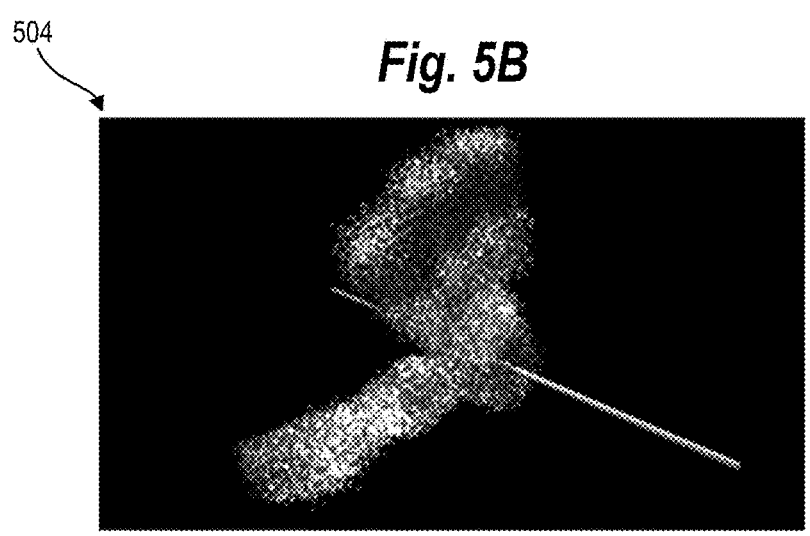

FIGS. 5A-5C illustrate images of digital models associated with a plurality of hinge axes for an object. Specifically, FIG. 5A illustrates an image 500 of a digital model with a ground-truth axis of the hinge joint for the object. The ground-truth axis defines the axis about which the hinge joint of the object rotates in a ground-truth case. After the digitizing system performs joint estimation for the ground-truth case, the digitizing system generates a digital model based on the joint estimation.

FIG. 5B illustrates an image 502 of a digital model with a hinge joint axis for an initially estimated joint with 5% noise in the digital scans. FIG. 5C illustrates an image 504 of a digital model with a hinge joint axis for an initially estimated joint with 10% noise in the digital scans. As illustrated, the hinge joint axes for initially estimated joints when noise is present in the digital scans can be inaccurate.

Various types of noise can affect the accuracy of an initial joint estimation. For example, noise in acquired data can produce artifacts in the captured geometry. Additionally, establishing reliable correspondences across a plurality of digital scans can be difficult due to inaccurate geometry and ambiguities in the digital scans (e.g., flat, texture-less regions). Such imperfections can result in imperfect part segmentations and noise relative transformation estimations. Thus, the initial joint estimations can be inaccurate in joint type, global transformation, and/or joint parameters. By employing a refinement stage that uses SVD processes to get an initial estimate of the joint type and parameters and optimizes for the global transformation and joint parameters that better fit the scanned data. Furthermore, the digitizing system makes a plurality of initial predictions about the joint type and parameters that correspond to the scanned data and commits one of the plurality of predictions after the refinement stage.

One or more embodiments use a two-step iterative optimization process. In the first step, given a fixed set of correspondences between two components connected via a joint and an initial estimate of the joint parameters, the digitizing system optimizes for the joint parameters that produce a transformation that better fits the digital scans. Specifically, one or more embodiments assume two image scans of an object in scan P and scan Q and an initial prediction about the existence of two components and the joint connecting the two components. In other words, the points in scan P are classified into groups $P_1$ and $P_2$, and the points in scan Q are classified into the corresponding groups $Q_1$ and $Q_2$. In order to align scan P with scan Q, the digitizing system finds a global rigid transformation A that maps $P_1$ to $Q_1$, and an additional transformation $T(x)$ induced by the connecting joint that maps $P_2$ to $Q_2$. x is a vector denoting the parameters of the joint for which the digitizing system optimizes.

In one or more embodiments, to solve for A and x jointly, the digitizing system applies the following minimization algorithm:

$$\min_{A,x} \sum_{p_i \in P_1} (A * p_i - q_i)^2 + \sum_{\hat{p} \in P_2} (T(x) * A * \hat{p}_i - \hat{q}_i)^2$$

where $(p_i, q_i)$ and $(\hat{p}_i, \hat{q}_i)$ represent correspondences across the different components of the object. Using a minimization algorithm causes the digitizing system to jointly determine and optimize the global transformation and the joint parameters. In other words, the minimization algorithm finds a global transformation and joint parameters that reduces an overall error. This is in contrast to finding the global transformation with the smallest error and separately finding the joint parameters with the smallest error but that may conflict with the global transformation. In alternative embodiments, the digitizing system uses another non-linear optimization method. Once the digitizing system optimizes the global transformation and the joint parameters, the digitizing system aligns the digital scans, including both components, and updates the point-to-point correspondences. After updating the correspondences, the digitizing system re-performs the segmentation by grouping the correspondences based on the transformations they induce and repeats the joint estimation analysis. Iterating between the joint estimation analysis and constraint-based alignment steps converges to a joint estimation that explains the acquired scans as closely as possible.

Figure 6C:
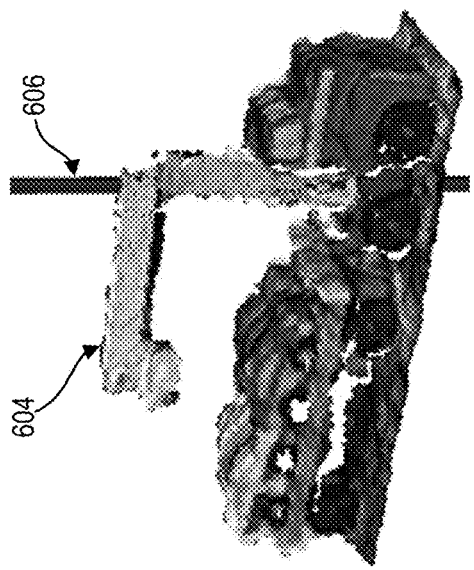
FIGS. 6A-6C illustrate a plurality of digital scans and a predicted object in accordance with one or more embodiments.
Figure 6B:
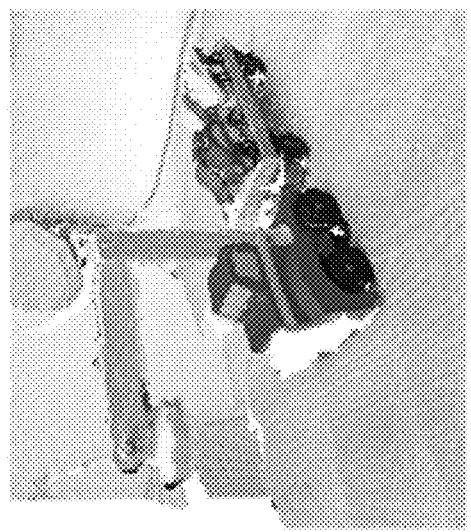
Figure 6A:
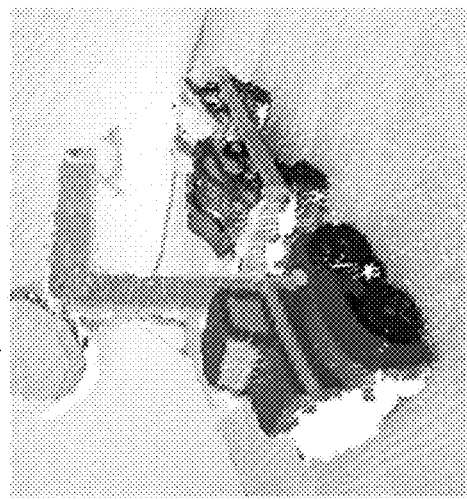

FIGS. 6A-6C illustrate image scans of an object and a digital model associated with the image scans. Specifically, FIG. 6A illustrates a digital scan 600 of the object in a first position (e.g., with a first component in a first position), and FIG. 6B illustrates a digital scan 602 of the object in a second position (e.g., with the first component in a second position). FIG. 6C illustrates a digital model 604 of the object that the digitizing system recreated with a hinge joint axis 606 based on the positions of the object in the image scans. As illustrated, the digital model includes a hinge joint axis 606 that functions similarly to the real-world object from the digital scans.

As previously mentioned, capturing the functionality of objects can be useful for many different applications. After generating a digital model of an object, a user may pose the model in different configurations and even animate the model. Additionally, one or more embodiments provide a constrained editing setup where the user edits one part of the object and the remaining parts adapt automatically to preserve the identified functionalities. Other implementations allow for exploration of how a three-dimensional reconstruction of an object, along with the encoded component-based functionalities, allow for changing the configuration/pose of the object in the digital scans.

Figure 7:
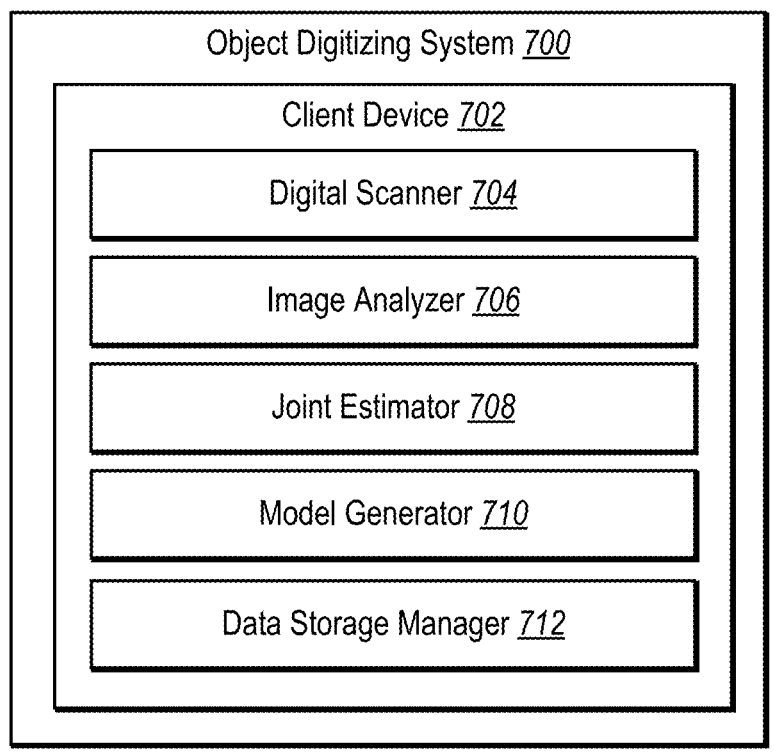
FIG. 7 illustrates a schematic diagram of an object digitizing system in accordance with one or more embodiments.

As described above, an object digitizing can generate digital models of real-world objects. FIG. 7 illustrates a schematic diagram of an object digitizing system 700 including a client device 702 for performing one or more operations of the object digitizing system 700 described herein. The object digitizing system 700 can include, but is not limited to, a digital scanner 704, an image analyzer 706, a joint estimator 708, a model generator 710, and a data storage manager 712. Although the object digitizing system 700 of FIG. 7 is depicted as having various components, the object digitizing system 700 may have any number of additional or alternative components. Additionally, although FIG. 7 illustrates the object digitizing system 700 including the components on a single client device 702, the object digitizing system 700 can include one or more of the illustrated components on a plurality of devices.

In one or more embodiments, each of the components and subcomponents of the object digitizing system 700 can be in communication with one another using any suitable communication technologies. It will be recognized that although the subcomponents of the object digitizing system 700 are shown to be separate in FIG. 7, any of the subcomponents may be combined into fewer components, such as into a single component, or divided into more components as may serve a particular implementation. Furthermore, although the components of FIG. 7 are described in connection with the object digitizing system 700, at least some of the components for performing operations in conjunction with the object digitizing system 700 described herein may be implemented on other devices and/or with other systems.

The components of the object digitizing system 700 can include software, hardware, or both. For example, the components of the object digitizing system 700 (e.g., the digital scanner 704, the image analyzer 706, the joint estimator 708, the model generator 710, and the data storage manager 712) can include one or more instructions stored on a computer-readable storage medium and executable by processors of one or more computing devices such as the client device 702. When executed by the one or more processors, the computer-executable instructions of the object digitizing system 700 can cause the computing device(s) to perform the object digitizing processes described herein. Alternatively, the components of the object digitizing system 700 can comprise hardware, such as a special purpose processing device to perform a certain function or group of functions. Additionally, the components of the object digitizing system 700 can comprise a combination of computer-executable instructions and hardware.

Furthermore, the components of the object digitizing system 700 performing the functions described herein with respect to the object digitizing system 700 may, for example, be implemented as part of a stand-alone application, as a module of an application, as part of a suite of applications, as a plug-in for applications including content creation applications, as a library function or functions that may be called by other applications, and/or as a cloud-computing model. Thus, the components of the object digitizing system 700 may be implemented as part of a stand-alone application on a personal computing device or a mobile device. Alternatively or additionally, the components of the object digitizing system 700 may be implemented in any application that allows delivery of content to users, including, but not limited to, applications in ADOBE® CREATIVE CLOUD® and ADOBE® PHOTOSHOP®. "ADOBE", "CREATIVE CLOUD", and "PHOTOSHOP" are registered trademarks of Adobe Systems Incorporated in the United States and/or other countries.

As previously described, the object digitizing system 700 can include a digital scanner 704. In particular, the digital scanner 704 facilitates scanning of objects to create digital scans. For example, the digital scanner 704 obtains a plurality of digital scans of an object in a plurality of different positions. To illustrate, the digital scanner 704 can communicate with a digital camera to obtain the plurality of digital scans (i.e., digital images) of the object. Alternatively, the digital scanner 704 can obtain digital scans of the object from another source, such as previously captured digital scans of the object from another system.

The object digitizing system 700 also includes an image analyzer 706 to analyze the digital scans that the digital scanner 704 obtains. Specifically, the image analyzer 706 analyzes the images to identify a plurality of components of an object from a plurality of digital scans. For example, the image analyzer 706 identifies at least a first component and a second component of the object. The image analyzer 706 can use image processing techniques to recognize separate components, such as by identifying visible boundaries, as previously described.

Additionally, the image analyzer 706 determines a plurality of correspondences for the plurality of components of the object. In particular, the image analyzer 706 determines a correspondence based on similar positions, locations, or components in a first digital scan and at least a second digital scan. For example, the image analyzer 706 can determine that a specific component or point on a component corresponds to a specific location in the first digital scan and the second digital scan (and any additional digital scans). A correspondence describes the relationship between a specific location in the first digital scan and a corresponding location in the second digital scan, allowing the digitizing system 700 to recognize changes in component positions across a plurality of digital scans.

The digital system 700 also includes a joint estimator 708 to facilitate estimation of one or more joints in an object. In particular, the joint estimator 708 estimates a joint based on a plurality of correspondences for an object. The joint estimator 708 estimates a joint type that fits to the positions of the first component and the second component of the object across the plurality of digital scans. For example, the joint estimator 708 determines that the joint type is a fixed joint (one component), a prismatic joint, a hinge joint, a sliding joint, a ball joint, or no joint (freely moving components).

The joint estimator 708 can also determine a global transformation and one or more joint parameters for a joint. For example, the joint estimator 708 determines a global transformation that transforms the first component and the second component from positions in the first digital scan to positions in the second digital scan. Additionally, the joint estimator 708 determines one or more joint parameters that allow a joint between the first component and the second component to move in a way that fits to the digital scans. The joint estimator 708 can use the determined global transformation and one or more joint parameters to update the correspondences, and then re-estimate the joint with the updated correspondences.

Additionally, the digitizing system 700 includes a model generator 710 to generate a digital model for an object. In particular, the model generator 710 generates a digital model to include the structure and functionality of the object based on the digital scans. For example, the model generator 710 generates the digital model to include the components and joints from the real-world model. The components in the digital model move according to the joint type and joint parameters, as determined by the joint estimator 708, such that the digital model replicates the functionality of the object. A user may view, modify, and/or otherwise interact with the digital model in one or more applications compatible with the digital model.

The object digitizing system 700 also includes a data storage manager 712 to manage data that the other components in the object digitizing system 700 use and/or produce. Specifically, the data storage manager 712 can communicate with the other components in the object digitizing system 700 (i.e., the digital scanner 704, the image analyzer 706, the joint estimator 708, and the model generator 710) to obtain data that the components have produced for storage and/or use by one or more of the components. To illustrate, the data storage manager 712 can store data that includes, but is not limited to, digital scans, a digital model of an object, information associated with generating the digital model, and/or other information in connection with digitizing objects.

FIGS. 1A-7, the corresponding text, and the examples, provide a number of different systems and devices for generating digital models of objects. In addition to the foregoing, embodiments can be described in terms of flowcharts comprising acts and steps in a method for accomplishing a particular result. For example, FIGS. 8 and 9 illustrate flowcharts of exemplary methods in accordance with one or more embodiments.

Figure 8:
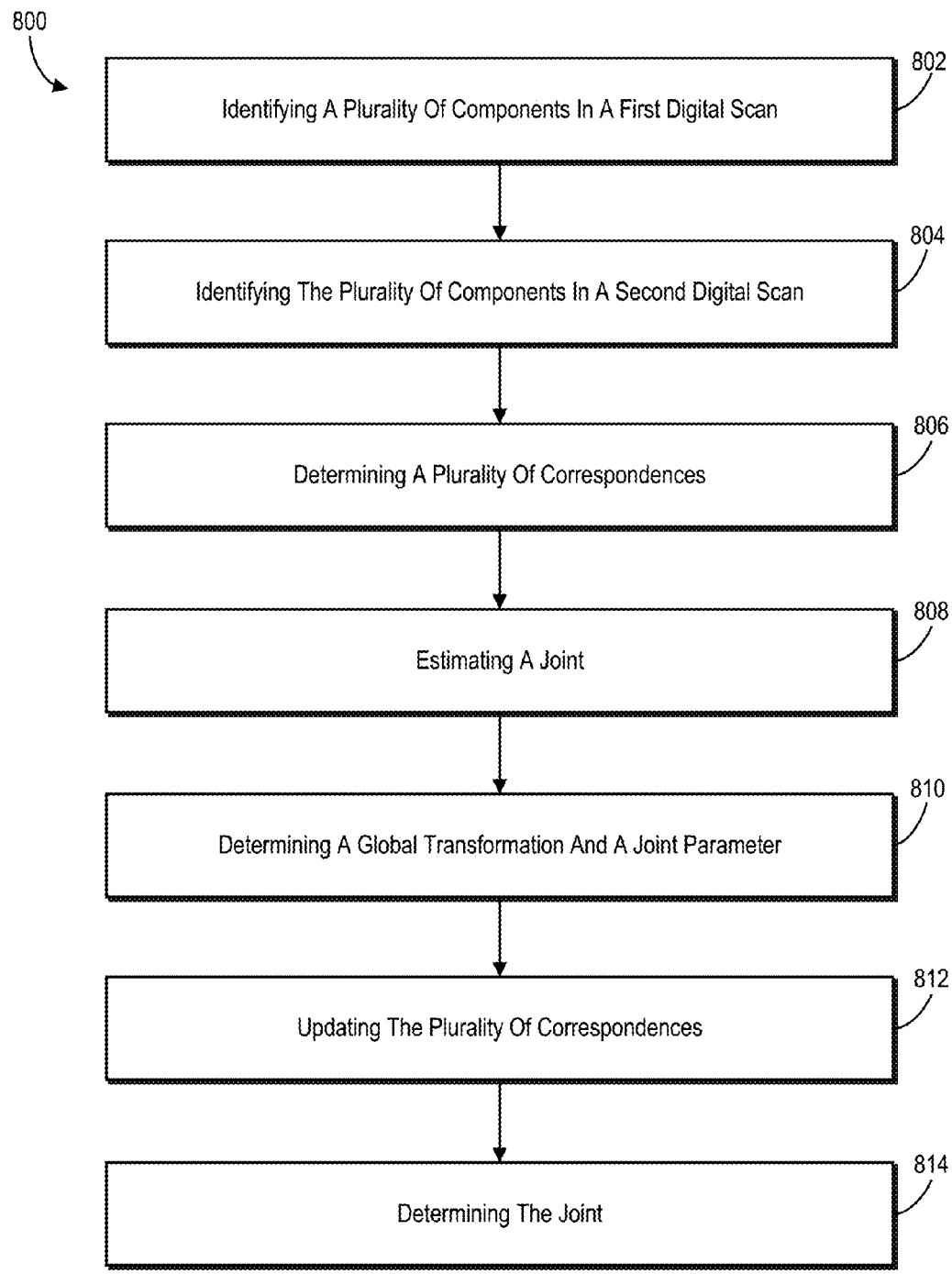
FIG. 8 illustrates a flowchart of a series of acts in a method of determining structure of scanned objects in accordance with one or more embodiments.
Figure 9:
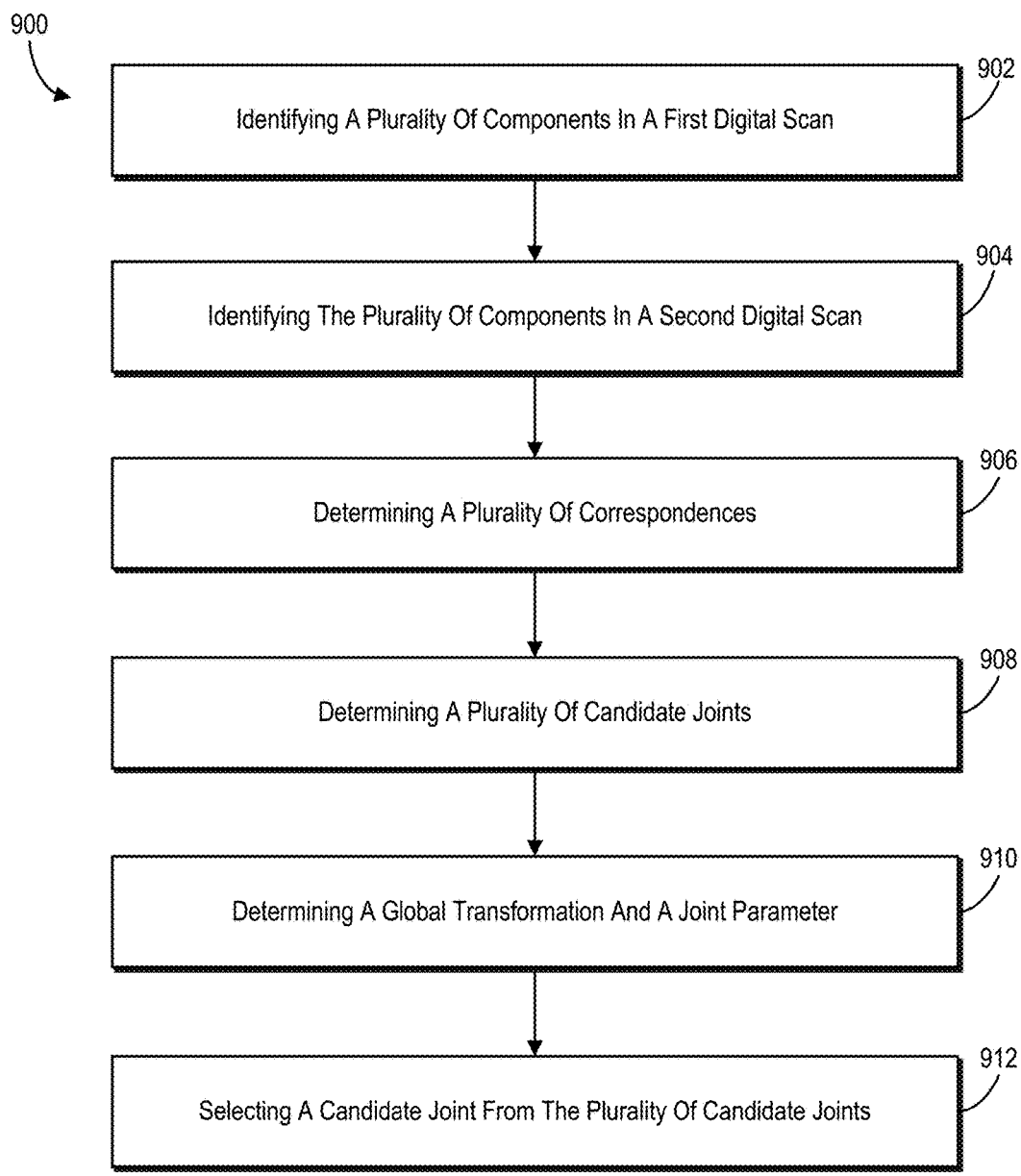
FIG. 9 illustrates a flowchart of a series of acts in another method of determining structure of scanned objects in accordance with one or more embodiments.

FIG. 8 illustrates a flowchart of a series of acts in a method 800 of determining structure of scanned objects. The method 800 includes an act 802 of identifying a plurality of components in a first digital scan 208. For example, act 802 involves identifying a first component 202 and a second component 204 in a first digital scan 208 of an object 200. Act 802 can involve identifying components using image processing techniques. For example, act 802 can involve identifying visual boundaries of the object 200 in the first digital scan 208.

The method 800 also includes an act 804 of identifying the plurality of components in a second digital scan 210. For example, act 804 involves identifying the first component 202 and the second component 204 in a second digital scan 210 of the object. Act 804 can involve identifying the at least two components from the first digital scan 208 in the second digital scan 210. Act 804 can also involve identifying the at least two components in one or more additional digital scans.

As part of act 804, or as an additional act, the method 800 can include generating a first digital model based on the first digital scan 208, the first digital model comprising the first component 202 and the second component 204, and generating a second digital model based on the second digital scan 210, the second digital model comprising the first component 202 and the second component 204.

The method 800 further includes an act 806 of determining a plurality of correspondences. For example, act 806 involves determining a plurality of correspondences for the first and second components in the first digital scan 208 and the second digital scan 210. Act 806 can involve determining at least one correspondence associated with a feature of the first component in the first digital scan 208 and a feature of the first component 202 in the second digital scan 210, and determining at least one correspondence associated with a feature of the second component in the first digital scan 208 and a feature of the second component 204 in the second digital scan 210. For example, act 806 can involve identifying a location associated with a component in the first digital scan 208 that corresponds to a location associated with the component in the second digital scan 210. Act 806 can also involve identifying one or more visual features of the first component 202 and the second component 204 as one or more correspondences at one or more locations of the object 200.

Additionally, the method 800 includes an act 808 of estimating a joint 206. For example, act 808 involves estimating a joint 206 connecting the first component 202 and the second component 204 based on the plurality of correspondences. Act 808 can involve using single value decomposition to estimate a joint type of the joint 206. Act 808 can also involve estimating the joint 206 to be a prismatic joint, a hinge joint, a sliding hinge joint, a ball joint, or no joint based on singular values of the single value decomposition.

The method 800 includes an act 810 of determining a global transformation and a joint parameter. For example, act 810 involves jointly determining a global transformation and a joint parameter that map the first and second components of the object 200 from the first digital scan 208 to the second digital scan 210. Act 810 can involve determining a global transformation that aligns the first component 202 of the first digital model with the first component 202 of the second digital model, and determining a joint parameter that aligns the second component 205 of the first digital model with the second component 204 of the second digital model.

As part of act 810, or as an additional act, the method 800 can include segmenting the plurality of correspondences for the plurality of components into a plurality of correspondence groups, and determining a global transformation and one or more joint parameters that fit the plurality of components of the first digital scan 208 to the second digital scan 210 by applying a minimization algorithm to the plurality of correspondence groups.

The method 800 also includes an act 812 of updating the plurality of correspondences. For example, act 812 involves updating the plurality of correspondences using the determined global transformation and joint parameter. Act 812 can involve modifying at least one correspondence associated with the first component 202 or the second component 204 based on the determined global transformation and joint parameter.

Additionally, the method 800 includes an act 814 of determining the joint. For example, act 814 involves determining the joint of the component based on the plurality of updated correspondences. Act 814 can also include iteratively alternating between determining a global transformation and a joint parameter and re-estimating the joint. For example, act 814 can involve determining that a confidence level of the estimated joint meets a predetermined confidence threshold.

The method 800 can include an act of generating a digital model of the object 200 based on the updated plurality of correspondences and the determined joint. Additionally, the method 800 can include receiving a user input to modify the first component from the plurality of components of the object, and modifying the first component in the generated digital model according to the user input and according to the functionality of the determined joint.

FIG. 9 illustrates a flowchart of a series of acts in another method 900 of determining structure of scanned objects. The method 900 includes an act 902 of identifying a plurality of components in a first digital scan 208. For example, act 902 of identifying at least two components comprising a first component and a second component in a first digital scan 208 of an object 200. Act 902 can involve identifying the at least two components using image processing techniques. For example, act 902 can involve identifying visual boundaries of the object 200 in the first digital scan 208.

The method 900 includes an act 904 of identifying the plurality of components in a second digital scan 210. For example, act 904 involves identifying the at least two components including the first component 202 and the second component 204 in a second digital scan 210 of the object. Act 804 can involve identifying the at least two components from the first digital scan 208 in the second digital scan 210. Act 804 can also involve identifying the at least two components in one or more additional digital scans.

The method 900 also includes an act 906 of determining a plurality of correspondences. For example, act 906 involves determining a plurality of correspondences of the at least two components in a first digital scan 208 and a second digital scan 210. Act 906 can involve determining at least one correspondence associated with a feature of the first component 202 in the first digital scan 208 and a feature of the first component 202 in the second digital scan 204, and determining at least one correspondence associated with a feature of the second component 204 in the first digital scan 208 and a feature of the second component 204 in the second digital scan 210.

Additionally, the method 900 includes an act 908 of determining a plurality of candidate joints. For example, act 908 involves determining a plurality of candidate joints based on the plurality of correspondences. Act 908 can involve determining a plurality of positions of the first component 202 relative to the second component 204 based on the plurality of correspondences, and estimating a plurality of candidate joints based on the determined plurality of positions of the first component 202 relative to the second component 204.

As part of act 908, or as an additional act, the method 900 can include comparing a confidence level associated with each candidate joint from the plurality of candidate joints to a confidence threshold, and selecting, from the plurality of candidate joints, one or more candidate joints with a confidence level that meets the confidence threshold. For example, the method 900 can include estimating the plurality of candidate joints by determining a plurality of joint estimations that have confidence levels greater than zero.

The method 900 further includes an act 910 of determining a global transformation and a joint parameter. For example, act 910 involves determining, for a candidate joint from the plurality of candidate joints, a global transformation and a joint parameter that map the first component and the second component from the first digital scan 208 to the second digital scan 210. Act 910 can involve applying, for each candidate joint from the plurality of candidate joints, a minimization algorithm to the plurality of correspondences, the minimization algorithm outputting a global transformation and a joint parameter, and determining an estimation error for each candidate joint from the plurality of candidate joints based on the outputted global transformation and joint parameter.

The method 900 also includes an act 912 of selecting a candidate joint from the plurality of candidate joints. For example, act 912 involves selecting a candidate joint from the plurality of candidate joints with a lowest estimation error according to the determined global transformation and joint parameter. Act 912 can involve updating the plurality of correspondences based on the determined global transformation and joint parameter, determining a plurality of candidate joints based on the plurality of updated correspondences, and determining an estimation error for each candidate joint from the plurality of candidate joints. Additionally, act 912 can involve aligning the first image scan with the second image scan and updating the correspondences based on the determined global transformation and joint parameter, and updating the plurality of correspondences in association with the aligned first image scan and second image scan.

The method 900 can also include iteratively alternating between determining a plurality of candidate joints and determining, for each candidate joint from the plurality of candidate joints, a global transformation and a joint parameter, determining that an error estimation associated with a candidate joint from the plurality of candidate joints has the lowest estimation error, and selecting the candidate joint with the lowest estimation error as a final joint estimate.

Embodiments of the present disclosure may comprise or utilize a special purpose or general-purpose computer including computer hardware, such as, for example, one or more processors and system memory, as discussed in greater detail below. Embodiments within the scope of the present disclosure also include physical and other computer-readable media for carrying or storing computer-executable instructions and/or data structures. In particular, one or more of the processes described herein may be implemented at least in part as instructions embodied in a non-transitory computer-readable medium and executable by one or more computing devices (e.g., any of the media content access devices described herein). In general, a processor (e.g., a microprocessor) receives instructions, from a non-transitory computer-readable medium, (e.g., a memory, etc.), and executes those instructions, thereby performing one or more processes, including one or more of the processes described herein.

Computer-readable media can be any available media that can be accessed by a general purpose or special purpose computer system. Computer-readable media that store computer-executable instructions are non-transitory computer-readable storage media (devices). Computer-readable media that carry computer-executable instructions are transmission media. Thus, by way of example, and not limitation, embodiments of the disclosure can comprise at least two distinctly different kinds of computer-readable media: non-transitory computer-readable storage media (devices) and transmission media.

Non-transitory computer-readable storage media (devices) includes RAM, ROM, EEPROM, CD-ROM, solid state drives ("SSDs") (e.g., based on RAM), Flash memory, phase-change memory ("PCM"), other types of memory, other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to non-transitory computer-readable storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that non-transitory computer-readable storage media (devices) can be included in computer system components that also (or even primarily) utilize transmission media.

Computer-executable instructions comprise, for example, instructions and data which, when executed at a processor, cause a general purpose computer, special purpose computer, or special purpose processing device to perform a certain function or group of functions. In some embodiments, computer-executable instructions are executed on a general-purpose computer to turn the general-purpose computer into a special purpose computer implementing elements of the disclosure. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the disclosure may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, tablets, pagers, routers, switches, and the like. The disclosure may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Embodiments of the present disclosure can also be implemented in cloud computing environments. In this description, "cloud computing" is defined as a model for enabling on-demand network access to a shared pool of configurable computing resources. For example, cloud computing can be employed in the marketplace to offer ubiquitous and convenient on-demand access to the shared pool of configurable computing resources. The shared pool of configurable computing resources can be rapidly provisioned via virtualization and released with low management effort or service provider interaction, and then scaled accordingly.

A cloud-computing model can be composed of various characteristics such as, for example, on-demand self-service, broad network access, resource pooling, rapid elasticity, measured service, and so forth. A cloud-computing model can also expose various service models, such as, for example, Software as a Service ("SaaS"), Platform as a Service ("PaaS"), and Infrastructure as a Service ("IaaS"). A cloud-computing model can also be deployed using different deployment models such as private cloud, community cloud, public cloud, hybrid cloud, and so forth. In this description and in the claims, a "cloud-computing environment" is an environment in which cloud computing is employed.

Figure 10:
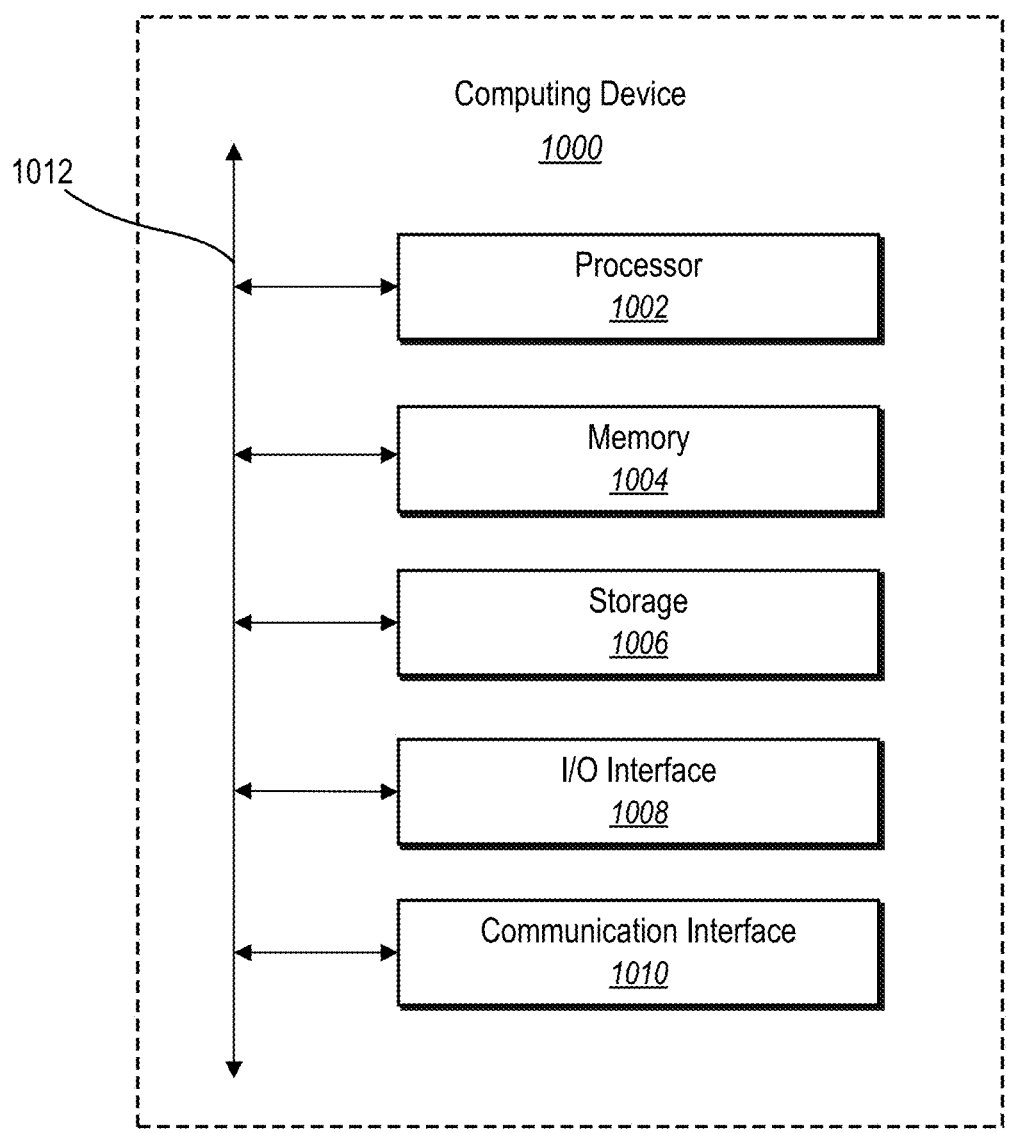
FIG. 10 illustrates a block diagram of an exemplary computing device in accordance with one or more embodiments.

FIG. 10 illustrates a block diagram of exemplary computing device 1000 that may be configured to perform one or more of the processes described above. One will appreciate that one or more computing devices such as the computing device 1000 may implement the object digitizing system 700. As shown by FIG. 10, the computing device 1000 can comprise a processor 1002, a memory 1004, a storage device 1006, an I/O interface 1008, and a communication interface 1010, which may be communicatively coupled by way of a communication infrastructure 1012. In certain embodiments, the computing device 1000 can include fewer or more components than those shown in FIG. 10. Components of the computing device 1000 shown in FIG. 10 will now be described in additional detail.

In one or more embodiments, the processor 1002 includes hardware for executing instructions, such as those making up a computer program. As an example and not by way of limitation, to execute instructions for digitizing real-world objects, the processor 1002 may retrieve (or fetch) the instructions from an internal register, an internal cache, the memory 1004, or the storage device 1006 and decode and execute them. The memory 1004 may be a volatile or non-volatile memory used for storing data, metadata, and programs for execution by the processor(s). The storage device 1006 includes storage, such as a hard disk, flash disk drive, or other digital storage device, for storing data or instructions related to object digitizing processes (e.g., digital scans, digital models).

The I/O interface 1008 allows a user to provide input to, receive output from, and otherwise transfer data to and receive data from computing device 1000. The I/O interface 1008 may include a mouse, a keypad or a keyboard, a touch screen, a camera, an optical scanner, network interface, modem, other known I/O devices or a combination of such I/O interfaces. The I/O interface 1008 may include one or more devices for presenting output to a user, including, but not limited to, a graphics engine, a display (e.g., a display screen), one or more output drivers (e.g., display drivers), one or more audio speakers, and one or more audio drivers. In certain embodiments, the I/O interface 1008 is configured to provide graphical data to a display for presentation to a user. The graphical data may be representative of one or more graphical user interfaces and/or any other graphical content as may serve a particular implementation.

The communication interface 1010 can include hardware, software, or both. In any event, the communication interface 1010 can provide one or more interfaces for communication (such as, for example, packet-based communication) between the computing device 1000 and one or more other computing devices or networks. As an example and not by way of limitation, the communication interface 1010 may include a network interface controller (NIC) or network adapter for communicating with an Ethernet or other wire-based network or a wireless NIC (WNIC) or wireless adapter for communicating with a wireless network, such as a WI-FI.

Additionally, the communication interface 1010 may facilitate communications with various types of wired or wireless networks. The communication interface 1010 may also facilitate communications using various communication protocols. The communication infrastructure 1012 may also include hardware, software, or both that couples components of the computing device 1000 to each other. For example, the communication interface 1010 may use one or more networks and/or protocols to enable a plurality of computing devices connected by a particular infrastructure to communicate with each other to perform one or more aspects of the digitizing processes described herein. To illustrate, the digitizing process can allow a plurality of devices (e.g., an image capture device and one or more processing computing devices) to exchange information using various communication networks and protocols for digitizing a real-world object.

In the foregoing specification, the present disclosure has been described with reference to specific exemplary embodiments thereof. Various embodiments and aspects of the present disclosure(s) are described with reference to details discussed herein, and the accompanying drawings illustrate the various embodiments. The description above and drawings are illustrative of the disclosure and are not to be construed as limiting the disclosure. Numerous specific details are described to provide a thorough understanding of various embodiments of the present disclosure.

The present disclosure may be embodied in other specific forms without departing from its spirit or essential characteristics. The described embodiments are to be considered in all respects only as illustrative and not restrictive. For example, the methods described herein may be performed with less or more steps/acts or the steps/acts may be performed in differing orders. Additionally, the steps/acts described herein may be repeated or performed in parallel with one another or in parallel with different instances of the same or similar steps/acts. The scope of the present application is, therefore, indicated by the appended claims rather than by the foregoing description. All changes that come within the meaning and range of equivalency of the claims are to be embraced within their scope.

What is claimed is:

1. A non-transitory computer readable storage medium comprising instructions that, when executed by at least one processor, cause a computer system to:
   identify, by at least one processor, a first component and a second component in a first digital scan of an object;
   identify, by the at least one processor, the first component and the second component in a second digital scan of the object;
   determine, by the at least one processor, a plurality of correspondences for the first component and the second component in the first digital scan and the second digital scan;
   estimate, by the at least one processor, a joint connecting the first component and the second component based on the plurality of correspondences by determining a plurality of candidate joints between the first component and the second component, wherein each candidate joint of the plurality of candidate joints comprises a separate confidence level;
   determine, by the at least one processor in response to determining that the confidence levels of the plurality of candidate joints are below a confidence threshold, a global transformation and a joint parameter that map the first component and the second component of the object from the first digital scan to the second digital scan using a minimization algorithm that jointly determines the global transformation and the joint parameter for the joint;
   align, by the at least one processor, the first digital scan with the second digital scan using the global transformation and the joint parameter;
   update, by the at least one processor, the plurality of correspondences by modifying at least one correspondence of the plurality of correspondences for the first component and the second component using the determined global transformation and joint parameter;
   determine, by the at least one processor, updated confidence levels for the plurality of candidate joints based on the updated plurality of correspondences;
   determine, by the at least one processor and from the plurality of candidate joints in response to determining that a confidence level of a candidate joint of the plurality of candidate joints meets the confidence threshold, the joint connecting the first component and the second component based on the plurality of updated correspondences; and
   generate a digital model comprising the determined joint representing a functionality of the object based on the plurality of updated correspondences.

2. The non-transitory computer readable storage medium as recited in claim 1, wherein the instructions that cause the computer system to determine the plurality of correspondences for the first component and the second component cause the computer system to:

determine at least one correspondence associated with a feature of the first component in the first digital scan and a feature of the first component in the second digital scan; and determine at least one correspondence associated with a feature of the second component in the first digital scan and a feature of the second component in the second digital scan.

3. The non-transitory computer readable storage medium as recited in claim 2, further comprising instructions that, when executed by the at least one processor, cause the computer system to identify a visual feature of the first component and the second component as a correspondence at a location of the object.

4. The non-transitory computer readable storage medium as recited in claim 1, wherein the instructions that cause the computer system to estimate the joint cause the computer system to use singular value decomposition to estimate a joint type of the joint.

5. The non-transitory computer readable storage medium as recited in claim 1, further comprising instructions that, when executed by the at least one processor, cause the computer system to:

generate a first digital model based on the first digital scan, the first digital model comprising the first component and the second component; and generate a second digital model based on the second digital scan, the second digital model comprising the first component and the second component.

6. The non-transitory computer readable storage medium as recited in claim 5, wherein the instructions that cause the computer system to determine the global transformation and one or more joint parameters cause the computer system to:

determine a global transformation that aligns the first component of the first digital model with the first component of the second digital model, the global transformation comprising a rotation and a translation of the first component; and determine a joint parameter for the joint that aligns the second component of the first digital model with the second component of the second digital model.

7. The non-transitory computer readable storage medium as recited in claim 1, wherein the instructions that cause the computer system to determine the joint connecting the first component and the second component cause the computer system to iterate between determining the global transformation and the joint parameter using the minimization algorithm and updating the plurality of correspondences until at least one confidence level of the plurality of candidate joints meets the confidence threshold.

8. The non-transitory computer readable storage medium as recited in claim 1, wherein the instructions that cause the computer system to determine the global transformation and the joint parameter cause the computer system to:

segment the plurality of correspondences into a plurality of correspondence groups; and jointly determine the global transformation and the joint parameter that fit the first component and the second component of the first digital scan to the second digital scan by applying the minimization algorithm to the plurality of correspondence groups.

9. The non-transitory computer readable storage medium as recited in claim 1, further comprising instructions that, when executed by the at least one processor, cause the computer system to:

receive a user input to modify the first component of the object; and modify the first component in the generated digital model according to the user input and according to a functionality of the determined joint.

10. A non-transitory computer readable storage medium comprising instructions that, when executed by at least one processor, cause a computer system to:

identify, by at least one processor, a first component and a second component in a first digital scan of an object;

identify, by the at least one processor, the first component and the second component in a second digital scan of the object;

determine, by the at least one processor, a plurality of correspondences for the first component and the second component in the first digital scan and the second digital scan;

determine, by the at least one processor, a plurality of candidate joints between the first component and the second component based on the plurality of correspondences;

determine, by the at least one processor and for a candidate joint from the plurality of candidate joints, a global transformation and a joint parameter that map the first component and the second component from the first digital scan to the second digital scan using a minimization algorithm that jointly determines the global transformation and the joint parameter, each candidate joint from the plurality of candidate joints comprising a separate estimation error;

align the first digital scan with the second digital scan using the global transformation and the joint parameter;

update the plurality of correspondences by modifying at least one correspondence of the plurality of correspondences for the first component and the second component using the global transformation and the joint parameter;

determine updated estimation errors for the plurality of candidate joints based on the updated plurality of correspondences;

select, by the at least one processor in connection with the first component and the second component in response to updating the estimation errors for the plurality of candidate joints, a candidate joint from the plurality of candidate joints with a lowest estimation error according to the global transformation and the joint parameter; and generate a digital model comprising the selected candidate joint representing a functionality of the object.

11. The non-transitory computer readable storage medium as recited in claim 10, wherein the instructions that cause the computer system to determine the plurality of candidate joints cause the computer system to:

determine a plurality of positions of the first component relative to the second component based on the plurality of correspondences; and estimate a plurality of candidate joints based on the determined plurality of positions of the first component relative to the second component.

12. The non-transitory computer readable storage medium as recited in claim 11, wherein the instructions that cause the computer system to select the candidate joint from the plurality of candidate joints with the lowest estimation error cause the computer system to:

compare a confidence level associated with each candidate joint from the plurality of candidate joints to a confidence threshold; and select, from the plurality of candidate joints, a subset of candidate joints with confidence levels that meet the confidence threshold.

13. The non-transitory computer readable storage medium as recited in claim 10, wherein the instructions that cause the computer system to determine the global transformation and one or more joint parameters that map the first component and the second component from the first digital scan to the second digital scan cause the computer system to:
  apply, for each candidate joint from the plurality of candidate joints, the minimization algorithm to the plurality of correspondences to jointly determine the global transformation and the joint parameter; and
  determine an estimation error for each candidate joint from the plurality of candidate joints based on the global transformation and the joint parameter.

14. The non-transitory computer readable storage medium as recited in claim 10, wherein the instructions that cause the computer system to determine the global transformation and the joint parameter cause the computer system to:
  segment the plurality of correspondences into a plurality of correspondence groups; and
  jointly determine the global transformation and the joint parameter that fit the first component and the second component of the first digital scan to the second digital scan by applying the minimization algorithm to the plurality of correspondence groups.

15. The non-transitory computer readable storage medium as recited in claim 14, further comprising instructions that, when executed by the at least one processor, cause the computer system to:
  iteratively alternate between determining the plurality of candidate joints and using the minimization algorithm to determine, for each candidate joint from the plurality of candidate joints, the global transformation and the joint parameter until at least one confidence level of the plurality of candidate joints meets a confidence threshold; and
  select a candidate joint with a lowest estimation error as a final joint estimate for generating the digital model.

16. In a digital medium environment for determining structure of scanned objects, a system comprising:
  at least one processor;
  a non-transitory computer readable storage medium comprising instructions that, when executed by the at least one processor, cause the system to:
    identify a first component and a second component in a first digital scan of an object;
    identify the first component and the second component in a second digital scan of the object;
    determine a plurality of correspondences for the first component and the second component in the first digital scan and the second digital scan;
    estimate a joint connecting the first component and the second component based on the plurality of correspondences by determining a plurality of candidate joints between the first component and the second component, wherein each candidate joint of the plurality of candidate joints comprises a separate confidence level;
    determine, in response to determining that the confidence levels of the plurality of candidate joints are below a confidence threshold, a global transformation and a joint parameter that map the first component and the second component of the object from the first digital scan to the second digital scan using a minimization algorithm that jointly determines the global transformation and the joint parameter for the joint;
    align the first digital scan with the second digital scan using the global transformation and the joint parameter;
    update the plurality of correspondences by modifying at least one correspondence of the plurality of correspondences for the first component and the second component using the determined global transformation and the joint parameter;
    determine updated confidence levels for the plurality of candidate joints based on the updated plurality of correspondences;
    determine, from the plurality of candidate joints in response to determining that a confidence level of a candidate joint of the plurality of candidate joints meets the confidence threshold, the joint connecting the first component and the second component based on the plurality of updated correspondences; and
    generate a digital model comprising the determined joint representing a functionality of the object based on the plurality of updated correspondences.

17. The system as recited in claim 16, further comprising instructions that, when executed by the at least one processor, cause the system to determine the joint connecting the first component and the second component cause the system to iteratively alternate between determining the global transformation and the joint parameter using the minimization algorithm and updating the plurality of correspondences until at least one confidence level of the plurality of candidate joints meets the confidence threshold.

18. The system as recited in claim 16, wherein the instructions that cause the system to determine the global transformation and the joint parameter cause the system to determine a global transformation and a joint parameter that fit the first component and the second component of the first digital scan to the second digital scan for a plurality of candidate joints.

19. The system as recited in claim 18, further comprising instructions that, when executed by the at least one processor, cause the system to:
  determine an estimation error for each candidate joint from the plurality of candidate joints; and
  select a candidate joint from the plurality of candidate joints that includes a lowest estimation error.

20. The system as recited in claim 18, further comprising instructions that, when executed by the at least one processor, cause the system to:
  iteratively alternate between estimating a joint and using the minimization algorithm to determine the global transformation and the joint parameter until at least one confidence level of the plurality of candidate joints meets the confidence threshold; and
  generate the digital model comprising the first component and the second component connected by an estimated joint with a highest confidence level that meets the confidence threshold.

* * * * *